United States Patent
McNutt et al.

(10) Patent No.: US 6,856,143 B2
(45) Date of Patent: Feb. 15, 2005

(54) SYSTEM AND METHOD FOR MEASURING A CAPACITANCE OF A CONDUCTOR

(75) Inventors: Michael J. McNutt, El Toro, CA (US); Robin C. Sarma, Plano, TX (US); Yu-Sang Lin, Irvine, CA (US)

(73) Assignee: Texas Instruments Incorporated, Dallas, TX (US)

(*) Notice: Subject to any disclaimer, the term of this patent is extended or adjusted under 35 U.S.C. 154(b) by 312 days.

(21) Appl. No.: 10/172,190

(22) Filed: Jun. 14, 2002

(65) Prior Publication Data

US 2003/0231025 A1 Dec. 18, 2003

(51) Int. Cl.[7] ............................................. G01R 27/26
(52) U.S. Cl. ..................... 324/658; 324/675; 324/678; 324/679
(58) Field of Search .......................... 324/658, 649, 324/661, 662, 765, 686, 687, 537, 763, 678, 679, 713, 719, 519, 522, 158.1

(56) References Cited

U.S. PATENT DOCUMENTS

| | | | |
|---|---|---|---|
| 5,999,010 A | 12/1999 | Arora et al. ................. 324/765 |
| 6,366,098 B1 * | 4/2002 | Froment ...................... 324/678 |
| 6,404,222 B1 * | 6/2002 | Fan et al. .................... 324/765 |
| 6,501,283 B2 * | 12/2002 | Lindolf et al. .............. 324/679 |
| 6,549,029 B1 * | 4/2003 | Hsieh et al. ................ 324/769 |

* cited by examiner

Primary Examiner—Minh H Chau
(74) Attorney, Agent, or Firm—Peter K. McLarty; W. James Brady, III; Frederick J. Telecky, Jr.

(57) ABSTRACT

A method for measuring a capacitance of a device under test is provided that includes selectively charging and discharging a first conductor with a first set of p and n element-pairs in response to a voltage potential applied to the first set of p and n element-pairs. The method further includes selectively charging and discharging a second conductor with a second set of p and n element-pairs in response to a voltage potential applied to the second set of p and n element-pairs. Currents are measured at drains associated with the first set of p element-pairs as the first and second conductors charge and discharge such that a capacitance associated with the first conductor may be determined that is based on the drain currents.

17 Claims, 2 Drawing Sheets

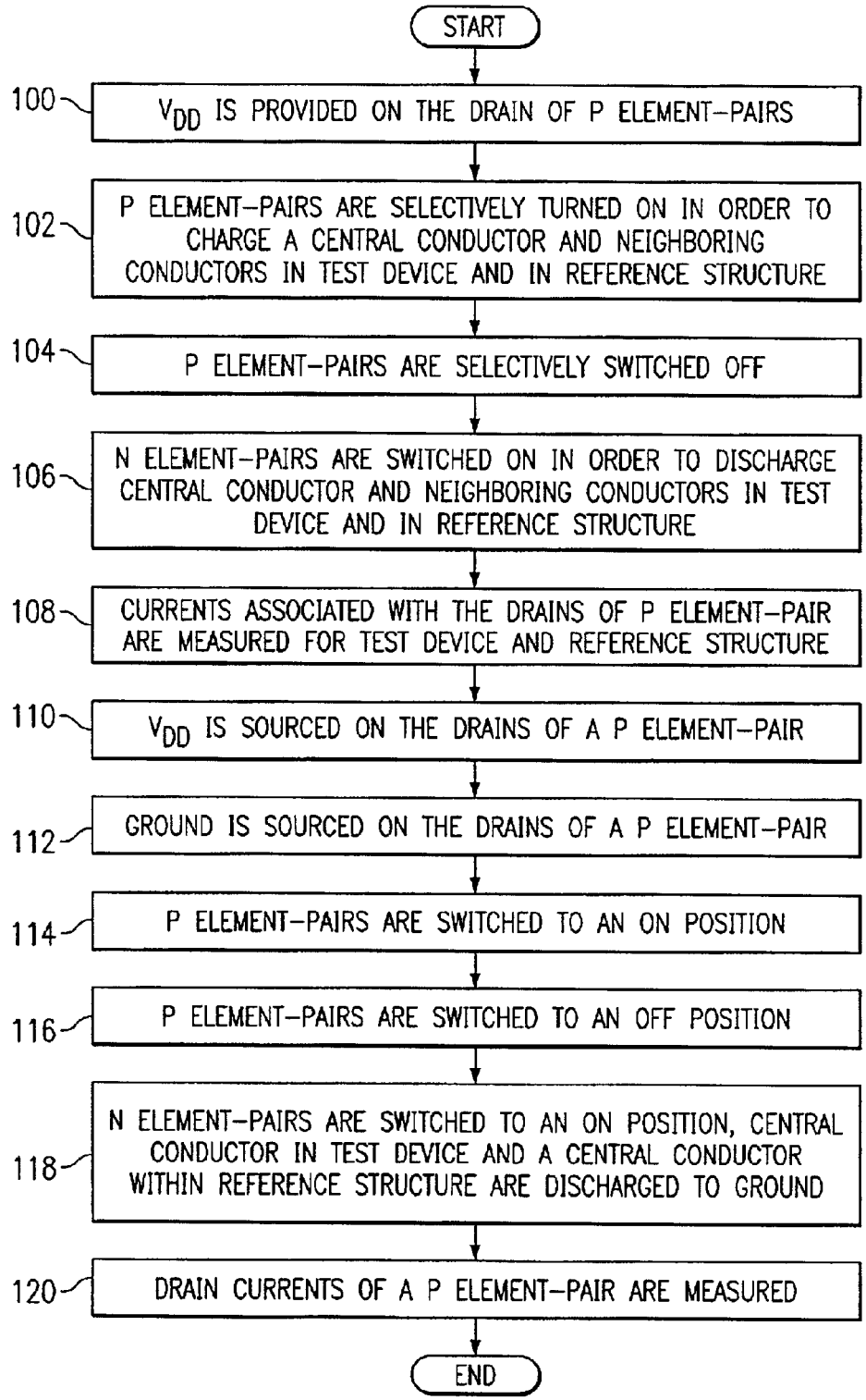

US 6,856,143 B2

SYSTEM AND METHOD FOR MEASURING A CAPACITANCE OF A CONDUCTOR

CROSS REFERENCE TO RELATED APPLICATIONS

This Application is related to U.S. patent application Ser. No. 10/176,888 filed Jun. 21, 2002, entitled "SYSTEM AND METHOD FOR USING A CAPACITANCE MEASUREMENT TO MONITOR THE MANUFACTURE OF A SEMICONDUCTOR," and U.S. patent application Ser. No. 10/187,671 filed Jul. 1, 2002, entitled "SYSTEM AND METHOD FOR MEASURING A CAPACITANCE ASSOCIATED WITH AN INTEGRATED CIRCUIT."

TECHNICAL FIELD OF THE INVENTION

This invention relates in general to the field of measurement and more particularly to a system and method for measuring a capacitance of a conductor.

BACKGROUND OF THE INVENTION

As integrated circuits have grown more complex, the ability to accurately measure the capacitance associated with semiconductor devices has equally grown more critical. Errors in modeling of the capacitance of semiconductors may contribute to discrepancies between the actual performance and reliability of integrated circuits when manufactured as compared with that predicted by design simulations. This may result in reduced tolerances in product specifications, incompatibility with neighboring components, poor performance, or the non-operation of associated devices. Accurate capacitance measurements for a given system provide the ability for correct specifications to be generated, whereby corresponding components or elements can function properly based on anticipated system parameters.

Several approaches for measuring system parameters (such as capacitance, for example) that have been employed are not satisfactory in all respects. For example, many of these approaches involve testing structures that are too large or cumbersome to accurately identify a capacitance associated with the device or structure under test. Additionally, hand measurements are virtually impossible and do not provide a feasible alternative for measuring capacitances associated with complex circuitry. In addition, many of these approaches involve measuring components or elements that inadvertently interact with the architecture targeted for the capacitance measurement. Such environmental effects generally cause inaccurate capacitance values to be obtained for a target device and further complicate the measurement process. Other approaches to measuring capacitances or other system parameters may be generally inadequate because they are destructive in nature, potentially sacrificing valuable product segments in order to initiate the measuring or testing process.

SUMMARY OF THE INVENTION

From the foregoing, it may be appreciated by those skilled in the art that a need has arisen for an improved measurement approach that provides the capability for accurate capacitance measurements for devices, elements, or integrated circuits. In accordance with one embodiment of the present invention, a system and method for measuring a capacitance of a conductor are provided that substantially eliminate or greatly reduce disadvantages and problems associated with conventional capacitance measurement techniques.

According to one embodiment of the present invention, there is provided a method for measuring a capacitance of a conductor that includes selectively charging and discharging a first conductor with a first set of p and n element-pairs in response to a voltage potential applied to the first set of p and n element-pairs. The method further includes selectively charging and discharging a second conductor with a second set of p and n element-pairs in response to a voltage potential applied to the second set of p and n element-pairs. Currents are measured at drains associated with the first set of p element-pairs as the first and second conductors charge and discharge such that a capacitance associated with the first conductor may be determined that is based on the drain currents.

Certain embodiments of the present invention may provide a number of technical advantages. For example, according to one embodiment of the present invention, a measurement approach is provided that measurement approach is provided that allows isolation and highly accurate measurement of the capacitance between a target conductor and one or more selected conductors in a structure. This is a result of the elimination of the capacitance between the target conductor and the non-selected conductors in the structure. The elimination of their capacitance is achieved by charging and discharging the target conductor and non-selected conductors in phase so that no charge difference occurs, effectively shorting these conductors. Accordingly, the capacitance of conductors that may otherwise act to negatively influence a capacitance measurement are removed from the measurement equation.

Another technical advantage of one embodiment of the present invention is a result of a null structure or a reference structure that is used to offset parasitic capacitances inherent in the measurement circuit. Measurement circuits may have parasitic capacitances stemming from transistors and other such components that generate an electric field and corresponding capacitance. In accordance with the teachings of the present invention, the null or reference structure operates to compensate for or offset the parasitic capacitances in the capacitance measurement.

Yet another technical advantage of one embodiment of the present invention is a result of the charging and discharging of conductors coupled to the measurement circuit. This allows the steady state current on the drain of an associated p-element to be obtained in order to determine a capacitance therefrom. Thus, an alternating current (AC) phenomenon may be converted into a direct current (DC) value, capable of a more simplistic, accurate, and direct measurement. Embodiments of the present invention may enjoy some, all, or none of these advantages. Other technical advantages may be readily apparent to one skilled in the art from the following figures, description, and claims.

BRIEF DESCRIPTION OF THE DRAWINGS

To provide a more complete understanding of the present invention and features and advantages thereof, reference is made to the following description, taken in conjunction with the accompanying figures, wherein like reference numerals represent like parts, in which:

FIG. 3 is a flowchart illustrating a series of steps associated with a method for measuring a capacitance of a conductor.

DETAILED DESCRIPTION OF THE INVENTION

Figure 1:
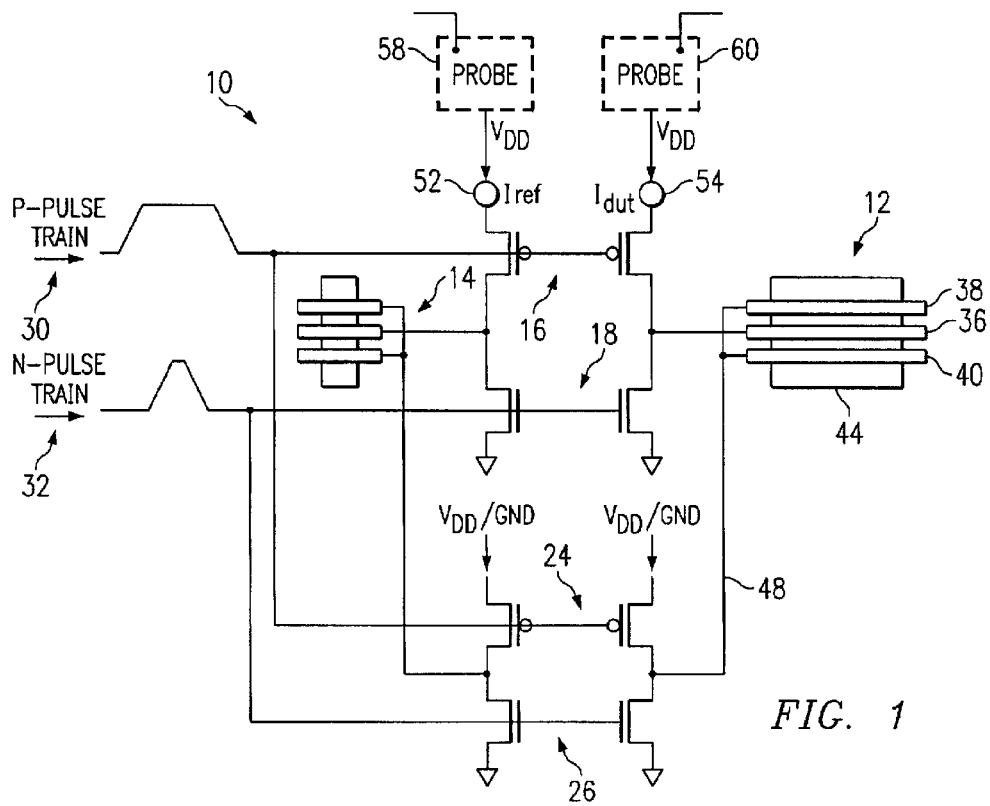
FIG. 1 is a simplified circuit diagram of a measurement system for measuring a capacitance of a conductor.

FIG. 1 is a simplified block diagram of a measurement system 10 for measuring a capacitance associated with a conductor, component or object. Measurement system 10 includes test device 12, a reference structure 14, a first set of p and n element-pairs 16 and 18, and a second set of p and n element-pairs indicated generally at 24 and 26. In general, each element or section within test device 12 may have an additional set of p and n element-pairs similar to those illustrated in FIG. 1. Measurement system 10 additionally includes a p-pulse train input indicated generally at 30 and an n-pulse train input indicated generally at 32. The pulse trains may be arranged such that when one selected p element is ON, the n element is OFF and when the p element is OFF, the n element is ON.

In accordance with the teachings of the present invention, measurement system 10 operates to measure a capacitance associated with an element or section within test device 12. Elements within test device 12 may be selectively charged and discharged in response to p-pulse train 30 and n-pulse train 32. P element-pairs 16 and 24 and n element-pairs 18 and 26 may be switched ON and OFF at a designated frequency such that two currents may be measured at the drains associated with p element-pair 16. The currents may then be subtracted from each other in order to obtain a net current that reflects the capacitance of an element within test device 12 with respect to other elements within test device 12. Accordingly, selected elements within test device 12 may be charged and discharged, either in or out of phase in order to obtain a current at a corresponding drain that provides a basis for determining a capacitance associated with only the designated element of test device 12.

In addition, reference structure 14 may be used generally to offset parasitic capacitance effects of transistors or internal circuitry associated with measurement system 10. For example, p element-pair 16 and n element-pair 18 may each include some capacitance that may influence or otherwise skew a capacitance measurement that is associated with test device 12. Reference structure 14 may operate to eliminate parasitic capacitances by compensating for their presence when currents are measured at the drains of p element-pair 16. Accordingly, one drain current associated with reference structure 14 may be subtracted from another drain current associated with test device 12 such that inherent capacitances are effectively eliminated.

Additionally, the operation of charging and discharging elements within test device 12 using p-pulse train 30 and n-pulse train 32 offer a capability for measuring the average, steady-state currents on the drains of p element-pair 16. In this manner, an alternating current (AC) phenomenon may be converted into a direct current (DC) value that may be quickly and accurately measured.

Test device 12 is an element, a structure, or an object having a capacitance associated therewith to be evaluated or measured by measurement system 10. Test device 12 may include a central conductor 36, a set of neighboring conductors 38 and 40 proximate to central conductor 36, and a plate 44. In a particular embodiment of the present invention, central conductor 36 is the target element to which a capacitance measurement is sought to be taken. Central conductor 36 may be any wire, object, component, or element capable of generating a capacitance value. Central conductor 36 may be within or external to any component, device, system, or architecture. Neighboring conductors 38 and 40 may be any conductive or non-conductive elements positioned in the vicinity of central conductor 36. Neighboring conductors 38 and 40 may be any wire, object, component, or element that may have a capacitance value associated with it. The inputs and outputs associated with test device 12 may correspond to data pathways or couplings to any suitable element, such as logic gates, semiconductors, or any other component, device, object, or element. In a particular embodiment of the present invention, conductors 38 and 40 are physically shorted through a connection such that both may be charged and discharged by p and n element-pairs 24 and 26. In at least one respect, neighboring conductors 38 and 40 represent a single conductor as their connection effectively provides a short. In general, conductors 38 and 40 need not be connected, and each conductor may be independently charged and discharged by separate p and n element-pairs. Although illustrated as a straight line, central conductor 36 and neighboring conductors 38 and 40 may be any suitable shape and configured, arranged, or positioned in any appropriate manner where appropriate according to particular needs.

P element-pairs 16 and 24 and n element-pairs 18 and 26 are p and n semiconductor devices respectively that may switch ON and OFF in response to an applied voltage potential and pulse train inputs provided by p-pulse train 30 and n-pulse train 32, respectively. P element-pairs 16 and 24 and n element-pairs 18 and 26 may be any suitable p device, such as a P-MOSFET, for example, that is operable to selectively charge any of the elements within test device 12. In addition, n element-pairs 18 and 26 may be any suitable n device, such as an N-MOSFET, for example, that is operable to selectively discharge any of the elements within test device 12. Alternatively, p element-pairs 16 and 24 and n element-pairs 18 and 26 may be any suitable semiconductor component, element, or device, or a non-semiconductor element that is operable to provide selective charging and discharging of any element within test device 12. Suitable algorithms may be implemented in order to switch the potential of the drains of p element-pair 24 between $V_{DD}$ and ground or to selectively switch other semiconductor devices within measurement system 10 to ON and OFF positions.

P element-pairs 16 and 24 and n element-pairs 18 and 26 may be used to independently charge and discharge elements within test device 12 in a programmed manner in order to allow for the measurement of capacitances between any combination of elements or bodies in a multi-element environment of test device 12. By charging and discharging multiple conductors in phase, the capacitance between the conductors may be eliminated because no charge difference occurs between the conductors. This approach achieves the effect of an alternating current (AC) shorting of the conductors. The effect of p-pulse train 30 may be controlled by the application of a $V_{DD}$ potential to the drain of p element-pairs 16 and 24.

In operation, p element-pair 16 receives a voltage potential of $V_{DD}$ as illustrated in FIG. 1. As p element-pair 16 and n element-pair 18 switch to ON and OFF positions respectively, central conductor 36 may respond by charging to a voltage potential of $V_{DD}$. As p element-pair 16 and n element-pair 18 switch to OFF and ON positions respectively, central conductor 36 may respond by discharging to ground. In addition, p element-pair 24 may be suitably toggled between $V_{DD}$ and ground. P element-pair 24 and n element-pair 26 are coupled to neighboring conductors 38 and 40 through a connection 48 as illustrated in FIG. 1. Connection 48 operates as a short between neighboring conductors 38 and 40 in order to form a single conductor when a potential is applied to neighboring conductors 38 and 40. Depending on whether a voltage potential of $V_{DD}$ is applied to the drains of p element-pair 24 or the respective drains are grounded, neighboring conductors 38 and 40 may be charged and discharged in phase with central conductor 36 or kept at ground respectively. When neighboring conductors 38 and 40 are kept at ground, the current measured at the drain of p element-pair 16 is due to the capacitance of central conductor 36 with respect to neighboring conductors 38 and 40 and plate 44.

When neighboring conductors 38 and 40 are charged and discharged in phase (at any appropriate frequency, such as 1–10 MHz, for example) with central conductor 36, the capacitance associated with neighboring conductors 38 and 40 is eliminated such that a current may be measured that reflects only the capacitance with respect to plate 44. Thus, a total capacitance that accounts for all elements within test device 12 may be measured and an additional capacitance associated with central conductor 36 may also be measured with respect to plate 44. The latter capacitance value may then be subtracted from the former capacitance value in order to obtain a capacitance due to neighboring conductors 38 and 40.

Reference structure 14 is a null structure that is used to offset parasitic capacitances found in measurement system 10. Elements such as transistors, logic elements, or other semiconductor components or objects offer a capacitance that needs to be accounted for when making a capacitance measurement for central conductor 36. Reference structure 14 may comprise material similar to that of test device 12 in a particular embodiment of the present invention. However, reference structure 14 may alternatively comprise any suitable material according to particular needs. Reference structure 14 may also be the same height and include multiple conductors that are approximately the same width as test device 12. Reference structure 14 may change structurally in response to changes in test device 12. Generally, reference structure 14 may be configured to be symmetrical with respect to test device 12, whereby reference structure 14 includes elements similar to those included in test device 12. Reference structure 14 may include two neighboring conductors (similar to test device 12) that are shorted by a wire coupled to p element-pair 24 and n element-pair 26 in a particular embodiment of the present invention. A central conductor associated with reference structure 14 may be coupled to p element-pair 16 and n element-pair 18 as illustrated in FIG. 1. In addition, reference structure 14 includes an overhang feature that is associated with corresponding conductors and that is similarly provided in test device 12. This overhanging symmetry between reference structure 14 and test device 12 and its corresponding effects for purposes of taking capacitance measurements are described in more detail below with reference to FIGS. 2A–C. Suitable software may be used to configure reference structure 14 or other null devices that are used as a reference in measuring a capacitance associated with test device 12. It is important to note that reference structure 14 may be any suitable device or element having any suitable characteristics such that one or more parasitic capacitances may be negated or accounted for in measuring a capacitance value of central conductor 36.

In operation, reference structure 14 generates a current provided at a drain of p element-pair 16. The drain current associated with reference structure 14 may be subtracted from the current measurement taken at the other drain of p element-pair 16 in order to compensate for the impact of inherent capacitance effects. The removal or compensation of elements within measurement system 10 provide for more accurate capacitance measurements as elements that would otherwise skew a capacitance measurement associated with central conductor 36 are offset by reference structure 14.

Reference structure 14 cooperates with test device 12 in order to obtain a capacitance value associated with an element within test device 12. When p element-pair 16 is in an ON position, p element-pair 16 operates to charge central conductor 36 to a $V_{DD}$ potential. When p element-pair 16 is switched to an OFF position and n element-pair 18 is switched to the ON position, central conductor 36 may then be discharged to ground. Central conductor 36 continues to charge and discharge as associated p and n devices are switched ON and OFF. During the charging and discharging, a measurement of a current associated with the drain of p element-pair 16 may be obtained. The same general procedure is occurring with respect to reference structure 14.

P-pulse train 30 and n-pulse train 32 control or otherwise switch ON and OFF p and n devices or elements coupled thereto within measurement system 10. P-pulse train 30 and n-pulse train 32 may be generated by suitable pulse generators operable to provide pulsing signals to p element-pairs 16 and 24 and n elements pairs 18 and 26. P element-pairs 16 and 24 and n element-pairs 18 and 26 receive similar inputs from p-pulse train 30 and n-pulse train 32 respectively. P-pulse train 30 and n-pulse train 32 represent two continuous pulse trains that may be timed relative to each other at an initiation stage of measurement system 10. The pulsing signals may be applied when a set of probes 58 and 60 (discussed in more detail below) contact corresponding probe pads (potentially including a short delay in order to achieve a steady state).

Plate 44 is an element that may be grounded and that provides an environment for test device 12 during measurement of the capacitance associated with central conductor 36. Plate 44 may also be a conductor that is coupled to an additional set of p and n element-pairs similar to those at 24 and 26, and that is operable to charge and discharge where appropriate in order to obtain a capacitance measurement associated with central conductor 36. Whether plate 44 is grounded or set at a certain potential may be controlled by inputs provided to its p and n element-pairs.

A pair of current meters 52 and 54 may be provided at each of the drains of p element-pair 16. Current meters 52 and 54 operate to measure a current associated with reference structure 14 and test device 12 respectively. By subtracting the current obtained by current meter 52 from the current obtained by current meter 54, a net current may be obtained that compensates for internal parasitic capacitances found in measurement system 10. Thus, the impact of transistors or circuitry within measurement system 10 may be removed or otherwise accounted for by the implementation of reference structure 14 as a corresponding inherent current is factored into the capacitance measurement. After obtaining a net current, a capacitance may then be determined based on the equation: I (current)=C (capacitance)×V (voltage)×f (frequency). Frequency represents the frequency at which elements within test device 12 are charged and discharged, whereby the voltage represents the potential to which elements such as central conductor 36 are charged.

Probes 58 and 60 may also be included in measurement system 10 in order to provide a capacitance measurement associated with test device 12. Probes 58 and 60 may include suitable probe pads where appropriate and are coupled to current meters 52 and 54, respectively. Probes 58 and 60 may also include suitable software operable to identify additional parameters associated with test device 12 or to selectively determine information associated with test device 12 that is based on measurements taken or data collected by measurement system 10.

Figure 2A:
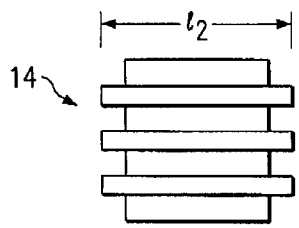
FIGS. 2A–C are diagrammatic views illustrating a reference structure, a target structure, and a net structure respectively of the measurement system.
Figure 2B:
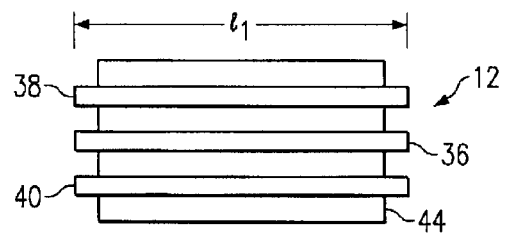
Figure 2C:
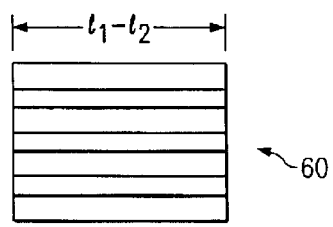

FIGS. 2A–C are diagrammatic views that illustrate an overhanging effect resulting from a conductor that protrudes beyond the length of an underlying plate structure. Reference structure 14 is illustrated in FIG. 2A, test device 12 is illustrated in FIG. 2B, and a resultant or net structure 60 is illustrated in FIG. 2C in order to teach the effects of an overhanging element or characteristic. Test device 12 includes conductor 36 having a length of $l_1$ and reference structure 14 includes a conductor having a length of $l_2$. Test device 12 includes plate 44 and reference structure 14 includes a similar plate element having approximately the same height. Resultant structure 60 represents the subtraction of $l_2$ from $l_1$ in order to provide a result that compensates for the overhanging effect of conductors that protrude beyond underlying elements or the environments associated with reference structure 14 and test device 12. For example, if $l_1$ and $l_2$ were 120 $\mu$m and 20 $\mu$m respectively, resultant structure 60 would reflect an effective capacitance over a 100 $\mu$m unit length.

Resultant structure 60 represents a more exact capacitance associated with the corresponding conductor that is targeted for measurement. The three-dimensional edge effects of conductors that may otherwise generate an electric field energy (thereby influencing capacitance measurements) may be negated with the implementation of reference structure 14. Accordingly, a two-dimensional capacitance may be obtained that removes the effects of the protruding ends of the conductor. A two-dimensional capacitance may be generally easier to model or otherwise to design for in developing a system or an architecture that includes the corresponding conductor.

The negation of overhanging effects is beneficial for a number of additional reasons. For example, it may be generally easier to correlate silicon measurements with two-dimensional analytical simulations instead of three-dimensional elements. In addition, parasitic extraction tools may require two-dimensional capacitance coefficients not provided by a three-dimensional element. Thus reference structure 14 allows end regions of a three-dimensional structure of a conductor to be accounted for in order to generate a more ideal two-dimensional capacitance per unit length result.

In operation, measurement system 10 may obtain a capacitance value for a designated element within test device 12. P element-pair 16 and n element-pair 18 may be used to charge and to discharge central conductor 36 of test device 12 and a similar central conductor of reference structure 14. P element-pair 24 and n element-pair 26 may also be used to perform other tasks, such as to maintain neighboring conductors 38 and 40 of test device 12 (and corresponding neighboring conductors within reference structure 14) at a reference potential. In addition, p element-pair 24 and n element-pair 26 may be used to charge neighboring conductors 38 and 40 of test device 12 (and corresponding neighboring conductors within reference structure 14) to a potential of $V_{DD}$ and further to discharge them synchronously in phase with central conductor 36. Additionally, p element-pair 24 and n element-pair 26 may be used to charge neighboring conductors 38 and 40 within test device 12 (and corresponding neighboring conductors within reference structure 14) to a potential of $V_{DD}$ and further to discharge them 180° out of phase with respect to central conductor 36. This operation may function to double the capacitance and corresponding measured current at a drain associated with p element-pair 16, which generally results in improved measurement accuracy.

Also, plate 44 and the plate associated with reference structure 14 may be kept at a designated reference potential, such as ground for example. Two non-overlapping pulse trains (p-pulse train 30 and n-pulse train 32) may be applied to p element-pairs 16 and 24 and n element-pairs 18 and 26. Two sets of measurements may then be obtained in accordance with one embodiment of the present invention.

In the first set of measurements, $V_{DD}$ may be provided on the drain of p element-pair 16 and p element-pair 24 by any suitable voltage source or an appropriate connection thereto. The associated p element-pairs may be turned ON in order to charge central conductor 36 and neighboring conductors 38 and 40 in both test device 12 and in corresponding elements within reference structure 14. The p elements may then be selectively switched OFF. N element-pairs 18 and 26 may then be switched ON in order to discharge central conductor 36 and neighboring conductors 38 and 40 in test device 12 and correspondingly in reference structure 14. The cycle may continue at any suitable frequency that produces reliable and suitable charging and discharging functions. Currents associated with the drains of p element-pair 16 may then be measured for both test device 12 and reference structure 14. When neighboring conductors 38 and 40 are charged and discharged in phase with central conductor 36, capacitances between central conductor 36 and neighboring conductors 38 and 40 are eliminated because no charge difference occurs between them.

In the second set of measurements, $V_{DD}$ is sourced on the drains of p element-pair 16 and may be provided by any suitable voltage source or an additional voltage source or an appropriate connection thereto. A ground may then be sourced on the drains of p element-pair 24 that keeps neighboring conductors 38 and 40 in test device 12 and in reference structure 14 at a fixed potential. At this point when p element-pairs 16 and 24 are switched to an ON position, only central conductor 36 in test device 12 and a corresponding central conductor of reference structure 14 are charged to $V_{DD}$. After these p elements are switched to an OFF position, n element-pairs 18 and 26 may be switched to an ON position and central conductor 36 in test device 12 and a corresponding central conductor within reference structure 14 are discharged to ground. The cycle may continue at any suitable frequency that produces reliable and suitable charging and discharging functions for measurement system 10. At this point, drain currents of p element-pair 16, which charges central conductor 36 and a central conductor associated with reference structure 14, may be measured.

The second set of measurements provides a total capacitance of central conductor 36 with respect to plate 44 and to neighboring conductors 38 and 40. The accuracy of the measurements may be checked by monitoring the DC characteristics of each of p element-pairs 16 and 24 and n element-pairs 18 and 26. The accuracy may also be checked by observing the linearity of the current measurements against frequency and voltage values.

FIG. 3 is a flowchart illustrating a series of steps associated with a method for measuring a capacitance of a conductor in accordance with one embodiment of the present invention. The method begins at step 100 where $V_{DD}$ is provided on the drains of p element-pairs 16 and 24 by any suitable voltage source or an appropriate connection thereto. At step 102, the associated p element-pairs may be turned ON in order to charge central conductor 36 and neighboring conductors 38 and 40 in both test device 12 and in corresponding elements within reference structure 14. The p elements may then be selectively switched OFF at step 104. At step 106, n element-pairs 18 and 26 may then be switched ON in order to discharge central conductor 36 and neighboring conductors 38 and 40 in test device 12 and in corresponding elements within reference structure 14. The cycle may continue at any suitable frequency that produces reliable and suitable charging and discharging functions for measurement system 10.

At step 108, currents associated with the drains of p element-pair 16 may then be measured for both test device 12 and reference structure 14. When neighboring conductors 38 and 40 are charged and discharged in phase with central conductor 36, capacitances between central conductor 36 and neighboring conductors 38 and 40 are eliminated because no charge difference occurs between them.

In a second set of measurements beginning at step 110, $V_{DD}$ is sourced on the drains of p element-pair 16 and may be provided by any suitable voltage source, or an additional voltage source, or an appropriate connection thereto. A ground may then be sourced on the drains of p element-pair 24 that keeps neighboring conductors 38 and 40 in test device 12 and in reference structure 14 at a fixed potential. This operation is illustrated by step 112. At step 114, when p element-pairs 16 and 24 are switched to an ON position, only central conductor 36 in test device 12 and a corresponding central conductor of reference structure 14 are charged to $V_{DD}$. After these p elements are switched to an OFF position at step 116, n element-pairs 18 and 26 may be switched to an ON position at step 118 and central conductor 36 in test device 12 and a corresponding central conductor within reference structure 14 are discharged to ground. The cycle may continue at any suitable frequency that produces reliable and suitable charging and discharging functions for measurement system 10. At this point, drain currents of p element-pair 16, which charges central conductor 36 and a central conductor associated with reference structure 14, may be measured as illustrated in step 120.

The total capacitance of central conductor 36 with respect to plate 44 and to neighboring conductors 38 and 40 is provided by the second set of measurements. The accuracy of the measurements may be checked by monitoring the DC characteristics of each p element-pairs 16 and 24 and n element-pairs 18 and 26. The accuracy may also be checked by observing the linearity of the current measurements against frequency and voltage values.

Some of the steps illustrated in FIG. 3 may be changed or deleted where appropriate and additional steps may also be added to the flowchart. These changes may be based on specific measurement architectures or particular testing arrangements and configurations of associated elements and do not depart from the scope or the teachings of the present invention.

Although the present invention has been described in detail with reference to particular embodiments, it should be understood that various other changes, substitutions, and alterations may be made hereto without departing from the spirit and scope of the present invention. For example, although the present invention has been described as operating with reference to a set of conductors, measurement system 10 may be extended to apply to any arbitrary number of conductors having any shape or configuration. Any device, element, or component capable of generating electric field energy, which serves as a basis for a capacitance measurement, may benefit from the teachings of the present invention.

Additionally, although the present invention has been described with reference to a single test device 12, measurement system 10 may be used to measure the total capacitance of multiple conductor structures (or multiple portions of test device 12) and further resolve the total capacitance of a target element into its corresponding components by use of a single structure. This single unit may include the addition of a p and n element-pair for each additional conductor that is introduced into test device 12 such that a scalability feature is achieved without a significant increase in area. Measurement system 10 operates generally to provide enhanced flexibility for measuring many capacitances from the same multiple conductor structure (which may be large and complex in certain circumstances). Measurement system 10 also operates to reduce the number of structures, whereby multiple variations may be achieved through test program controlling of DC voltages instead of moving or repositioning probes or changing pulse locations.

Numerous other changes, substitutions, variations, alterations, and modifications may be ascertained by those skilled in the art and it is intended that the present invention encompass all such changes, substitutions, variations, alterations, and modifications as falling within the spirit and scope of the appended claims. Moreover, the present invention is not intended to be limited in any way by any statement in the specification that is not otherwise reflected in the appended claims.

What is claimed is:

1. An apparatus for measuring a capacitance comprising:
   a first set of p and n element-pairs coupled to a first conductor and operable to selectively charge and discharge the first conductor in response to a voltage potential applied to the first set of p and n element-pairs;
   a second set of p and n element-pairs coupled to a second conductor and operable to selectively charge and discharge the second conductor in response to a voltage potential applied to the second set of p and n element-pairs, wherein currents are measured at drains associated with the first set of p element-pairs as the conductors charge and discharge such that a capacitance associated with the first conductor is determined based on the currents at the drains; and
   a reference structure coupled to the first and second sets of p and n element-pairs and operable to provide a calibration element for measuring the capacitance associated with the first conductor.

2. The apparatus of claim 1, further comprising:
   a p-pulse generator operable to generate a p-pulse train that is communicated to each of the first and second sets of p element-pairs such that each of the first and second sets of p element-pairs is selectively switched to ON and OFF positions.

3. The apparatus of claim 2, further comprising:
   an n-pulse generator operable to generate an n-pulse train that is communicated to each of the first and second sets of n element-pairs such that each of the first and second sets of n element-pairs is selectively switched to ON and OFF positions.

4. The apparatus of claim 1, further comprising:
   a first and a second current meter coupled to the first set of p element-pairs and operable to measure currents at the drains associated with the first set of p element-pairs such that the capacitance associated with the first conductor is determined based on the drain currents measured by the current meters, wherein the current measured by the first current meter is associated with a device under test that includes the first and second conductors and the current measured by the second current meter is associated with the reference structure.

5. The apparatus of claim 4, further comprising:

a first and a second probe coupled to the first and second current meters respectively and operable to generate the capacitance associated with the first conductor based on the currents measured at the drains associated with the first set of p element-pairs.

6. The apparatus of claim 1, further comprising:

a voltage source operable to provide a voltage potential to the first set of p and n element-pairs; and an additional voltage source that is selectively grounded and that provides a voltage potential to the second set of p and n element-pairs.

7. A method for measuring a capacitance, the method comprising:

selectively charging and discharging a first conductor with a first set of p and n element-pairs in response to a voltage potential applied to the first set of p and n element-pairs;

selectively charging and discharging a second conductor with a second set of p and n element-pairs in response to a voltage potential applied to the second set of p and n element-pairs, wherein currents are measured at drains associated with the first set of p element-pairs as the first and second conductors charge and discharge such that a capacitance associated with the first conductor is determined based on the drain currents; and providing a calibration element for measuring the capacitance associated with the first conductor, the calibration element including a reference structure coupled to the first and second sets of p and n element-pairs.

8. The method of claim 7, further comprising:

generating a p-pulse train that is communicated to each of the first and second sets of p element-pairs such that each of the first and second sets of p element-pairs is selectively switched to ON and OFF positions.

9. The method of claim 8, further comprising:

generating an n-pulse train that is communicated to each of the first and second sets of n element-pairs such that each of the first and second sets of n element-pairs is selectively switched to ON and OFF positions.

10. The method of claim 7, further comprising:

measuring currents at the drains associated with the first set of p element-pairs with first and second current meters such that the capacitance associated with the first conductor is determined based on the drain currents measured by the current meters, wherein the current measured by the first current meter is associated with a device under test that includes the first and second conductors and the current measured by the second current meter is associated with the reference structure.

11. The method of claim 10, further comprising:

generating the capacitance associated with the first conductor using first and second probes coupled to the first and second current meters respectively, wherein the capacitance associated with the first conductor is based on the currents measured at the drains associated with the first set of p element-pairs.

12. The method of claim 7, further comprising:

providing the voltage potential to the first and second sets of p and n element-pairs with a voltage source that is selectively grounded.

13. A system for measuring a capacitance comprising:

a device under test, the device under test including first, second and third conductors, the second and third conductors operable to be shorted together to provide a single pathway for electrical current;

a first set of p and n element-pairs coupled to the first conductor and operable to selectively charge and discharge the first conductor in response to a voltage potential applied to the first set of p and n element-pairs;

a second set of p and n element-pairs coupled to each of the second and the third conductor and operable to selectively charge and discharge the second and third conductors in response to a voltage potential applied to the second set of p and n element-pairs, wherein currents are measured at drains associated with the first set of p element-pairs as the conductors charge and discharge such that a capacitance associated with the first conductor is determined based on the drain currents; and a plate positioned proximate to the first, second, and third conductors and operable to be selectively grounded in order to provide a reference value for a capacitance measurement associated with the first conductor.

14. The system of claim 13, further comprising:

a p-pulse generator operable to generate a p-pulse train that is communicated to each of the first and second sets of p element-pairs such that each of the first and second sets of p element-pairs is selectively switched to ON and OFF positions.

15. The system of claim 13, further comprising:

an n-pulse generator operable to generate an n-pulse train that is communicated to each of the first and second sets of n element-pairs such that each of the first and second sets of n element-pairs is selectively switched to ON and OFF positions.

16. The system of claim 13, further comprising:

a reference structure coupled to the first and second sets of p and n element-pairs and operable to provide a calibration element for measuring the capacitance associated with the first conductor.

17. The system of claim 13, further comprising:

a voltage source operable to provide a voltage potential to the first set of p and n element-pairs; and an additional voltage source that is selectively grounded and that provides a voltage potential to the second set of p and n element-pairs.

* * * * *